United States Patent [19]
Fritsche

[11] Patent Number: 5,300,205
[45] Date of Patent: Apr. 5, 1994

[54] METHOD AND DEVICE FOR TREATING SUBSTRATES

[75] Inventor: Wolf-Eckart Fritsche, Kleinostheim, Fed. Rep. of Germany

[73] Assignee: Leybold Aktiengesellschaft, Hanau, Fed. Rep. of Germany

[21] Appl. No.: 32,420

[22] Filed: Mar. 16, 1993

Related U.S. Application Data

[63] Continuation of Ser. No. 766,435, Sep. 25, 1991, abandoned.

[30] Foreign Application Priority Data

Aug. 17, 1991 [DE] Fed. Rep. of Germany ....... 4127317

[51] Int. Cl.$^5$ .................... C23C 14/54; C23C 14/56
[52] U.S. Cl. ..................... 204/192.12; 204/298.08; 204/298.23; 204/298.26
[58] Field of Search ............. 204/192.12, 298.08, 204/298.23-298.26

[56] References Cited

U.S. PATENT DOCUMENTS

| 4,488,956 | 12/1984 | Scherer et al. | 204/298.23 |
| 4,902,394 | 2/1990 | Kenmotsu et al. | 204/192.12 |
| 5,015,493 | 5/1991 | Gruen | 427/571 |

FOREIGN PATENT DOCUMENTS

| 0432090 | 6/1991 | European Pat. Off. | |
| 3248121 | 6/1984 | Fed. Rep. of Germany | 204/298.23 |
| 3700633 | 5/1988 | Fed. Rep. of Germany | 204/192.31 |
| 271827 | 9/1989 | German Democratic Rep. | 204/298.08 |
| WO9112628 | 8/1991 | PCT Int'l Appl. | |

Primary Examiner—Aaron Weisstuch
Attorney, Agent, or Firm—Felfe & Lynch

[57] ABSTRACT

The invention relates to a device for coating substrates by sputtering out of a plasma with at least one anode, one cathode, and an electric dc current voltage source, connectable pulse-wise to the anode/cathode path. The length of the voltage pulses and/or the interval between the pulses is regulatable.

7 Claims, 4 Drawing Sheets

METHOD AND DEVICE FOR TREATING SUBSTRATES

This application is a continuation of application Ser. No. 766,435, filed Sep. 25, 1991, now abandoned.

The invention relates to a device for treating substrates using a plasma.

In coating substrates by the sputtering method it is occasionally required to apply different coating materials on the substrate, one beneath or above the other. To this end, either different targets must be fastened successively on a cathode or several cathodes must be provided in each instance with different targets.

If several substrates are transported sequentially through a sputtering installation in order to coat them, considerable problems occur thereby because the sputtering rates of different target materials differ. For example, metals have a significantly higher sputtering rate than reactively sputtered metal oxides or metal nitrides. If coating systems with sputtered layers disposed one above the other are to be generated on a substrate, for example in the sequence: adhesion means-metal-first dielectric-second dielectric, the constant speed with which the substrate is transported through the installation must be adapted to the lowest sputtering rate, i.e. the speed must be selected such that at the lowest sputtering rate the required layer thickness of the sputtered material builds up.

One possibility for increasing the transport speed of the substrate could reside in the adaptation of the electrical power with which the sputter cathode is operated to the particular target material. This power can, however, not be reduced to any desired degree because otherwise the plasma out of which the deposition of the sputtered material onto the substrate takes place, becomes extinguished.

In addition, the layer properties are a function of the sputtering voltage and consequently of the power of the cathode from which the coating is applied onto the substrate, so that for this reason also the power of the cathode cannot be changed in any given way.

In order to circumvent this difficulty, the number of targets with the lowest sputtering rate and consequently the number of associated cathodes relative to the other cathodes could be increased. Such measures, however, would increase the cost of the entire sputtering installation.

The approach in practice until now was to place in front of the cathodes diaphragms which were closed to an extent such that the desired sputtering rate was achieved. But this brought about the difficulty that the diaphragms were thickly coated and had to be cleaned frequently.

A method is already known for the gentle coating of electrically conducting objects according to the PVD method by means of ionized vapors from the dc voltage plasma of a glow discharge in which the electrical energy is applied with periodically repeated dc pulses (DE-P 37 00 633). The pulses therein have a voltage of more than 100 V, in particular between 200 and 800 V. They are capable of maintaining within the vacuum chamber a plasma which, on the one hand, largely excludes the danger of the formation of arcs and, on the other hand, also permits the effective coating of objects.

This known method can also be used in installations with a magnetron cathode. Yet the special difficulties which are encountered in sputtering processes with different sputtering materials, are not remedied.

The invention is therefore based on the task of being able to set with a high degree of precision the coating rate in the case of substrates which during dc sputtering are moved passed several sputtering cathodes in order to provide them with distinctly different layers.

This task is solved according to the features of the invention disclosed herein.

The advantage achieved with the invention resides in particular that the speed with which substrates are coated is independent of external conditions, for example the substrate advance speed or the sputtering rate of the slowest cathode. Herein the sputtering cathode is operated at a low sputtering rate which nevertheless sputters the particles with increased energy in order to achieve the desired layer properties.

Embodiment examples of the invention are depicted in the drawing and are described in greater detail in the following.

Figure 1:
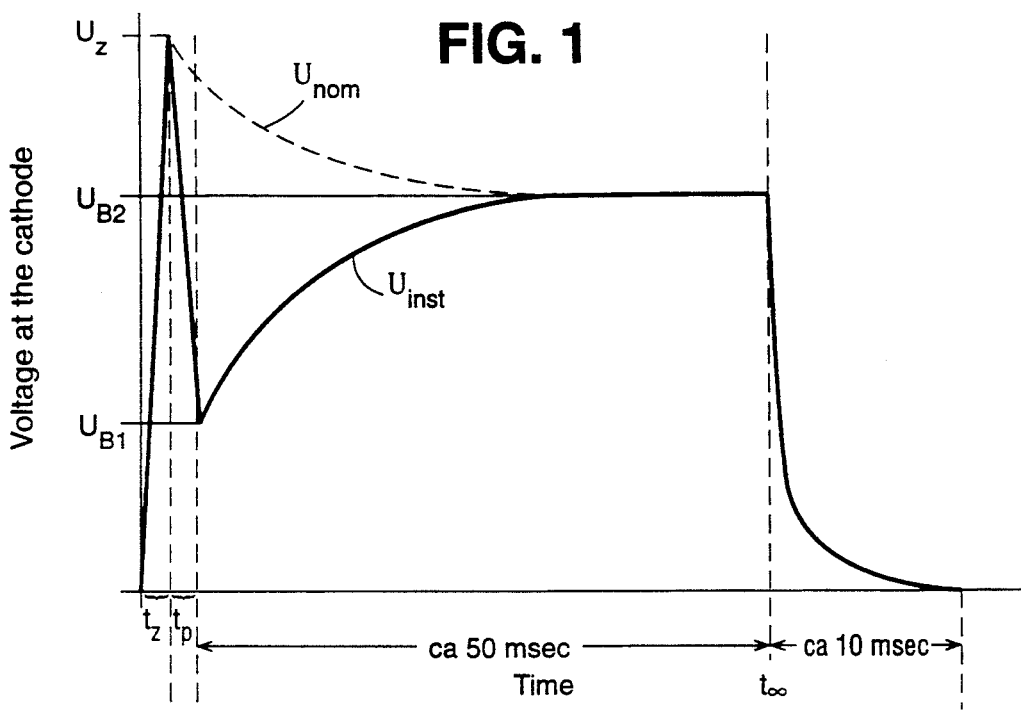
FIG. 1 shows a graphic representation of the voltage of a sputtering cathode as a function of time.

In FIG. 1 is shown the trace of the voltage over time at a cathode/anode path of a sputtering installation. After a dc voltage supply is switched on the voltage at the electrode of the sputtering installation builds up to the firing voltage $U_z$ within time $t_z$. Only from this voltage value $U_z$ on can a plasma be fired. Time $t_z$ in practice is approximately 0.5 to 6 microseconds and is determined by the time constant of the electronic circuitry of the sputtering cathode current supply. Now a plasma formation time $t_p$ passes before sufficient charge carriers have been formed in the ionized gas in order to generate a gas discharge. This time is determined by various parameters, for example by the time which elapses before the first electron/ion pair is generated, by the voltage which is present at the instance of firing at the anode and the cathode, by the effective cross section representing the probability with which an impact between an electron and an atom or an ion and an atom takes place, respectively, leading to the ionization, by the coefficients of the secondary electron emission of the target surface, by the pressure and consequently the mean free path length, as well as by the geometry of the sputtering apparatus which influences the path length of a particle $t_z + t_p$ is approximately 1 $\mu$s to 12 $\mu$s.

In the developing plasma are present charge carriers are present which flow off at an electrode. Hereby a discharge current flows so that the voltage of the sputtering current supply breaks down and falls to a value $U_{B1}$. The discharge current flowing during time $t_p$ is shown in further detail in FIG. 2. Due to the regulation constant, within time $t_p$ only the maximum current $I_{B1}$ can be supplied.

The voltage $U_{B1}$ characterizes a stable plasma in which a particular electrical equilibrium has been attained. After the voltage has assumed its lowest value $U_{B1}$, it gradually increases again and specifically to a value $U_{B2}$ at time $t_\infty$. This voltage $U_{B2}$ is the firing voltage which is determined by the physical influences of the plasma as well as by the nominal value $U_{nom}$ preselected by regulation of the current supply. At intervals of time greater than $t_\infty$ no further changes occur in the voltage of the discharge. The voltage value $U_{B2}$ is achieved thereby, wherein the current which can be supplied increases to the value $I_{B2}$ with a particular time regulation constant.

As has already been mentioned, for firing the plasma the voltage $U_z$ is required, i.e. the nominal voltage value or the terminal voltage made available would need to reach or exceed this value $U_z$ during the switch-on process. If the voltage supply were to continue to make available the voltage $U_z$ regulation of the gas discharge would not be possible any more, and it would operate with full nominal power.

In order to prevent this, the nominal voltage value $U_{nom}$ is lowered from $U_z$ to $U_{B2}$ within time $t_\infty$ in which the discharge current can reach the final value $I_{B2}$.

Consequently, the voltage $U_{B2}$ results, on the one hand, from the increase of voltage $U_{inst}$ to $U_{B2}$ at the anode/cathode path and, on the other hand, from the lowering of the terminal voltage from $U_z$ to $U_{B2}$.

If the voltage supply is switched off at time $t_\infty$ the anode/cathode voltage decreases with a time constant of approximately 10 ms wherein this time constant is a function of the electrical circuitry of the voltage supply.

Figure 2:
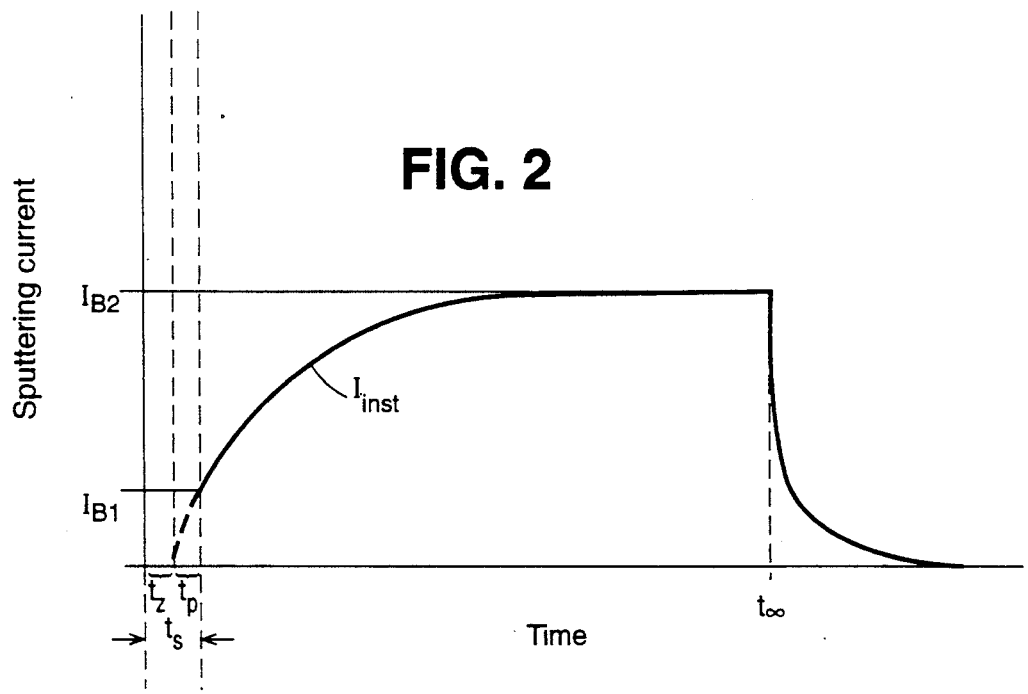
FIG. 2 shows a graphic representation of the sputtering current over time.

Consequently, on the basis of the curves according to FIG. 1 and 2, it is apparent that the sputtering process proper starts after time $t_s = t_p$ because only after this time $t_s$ a particular stabilization of the plasma has been reached.

Figure 3:
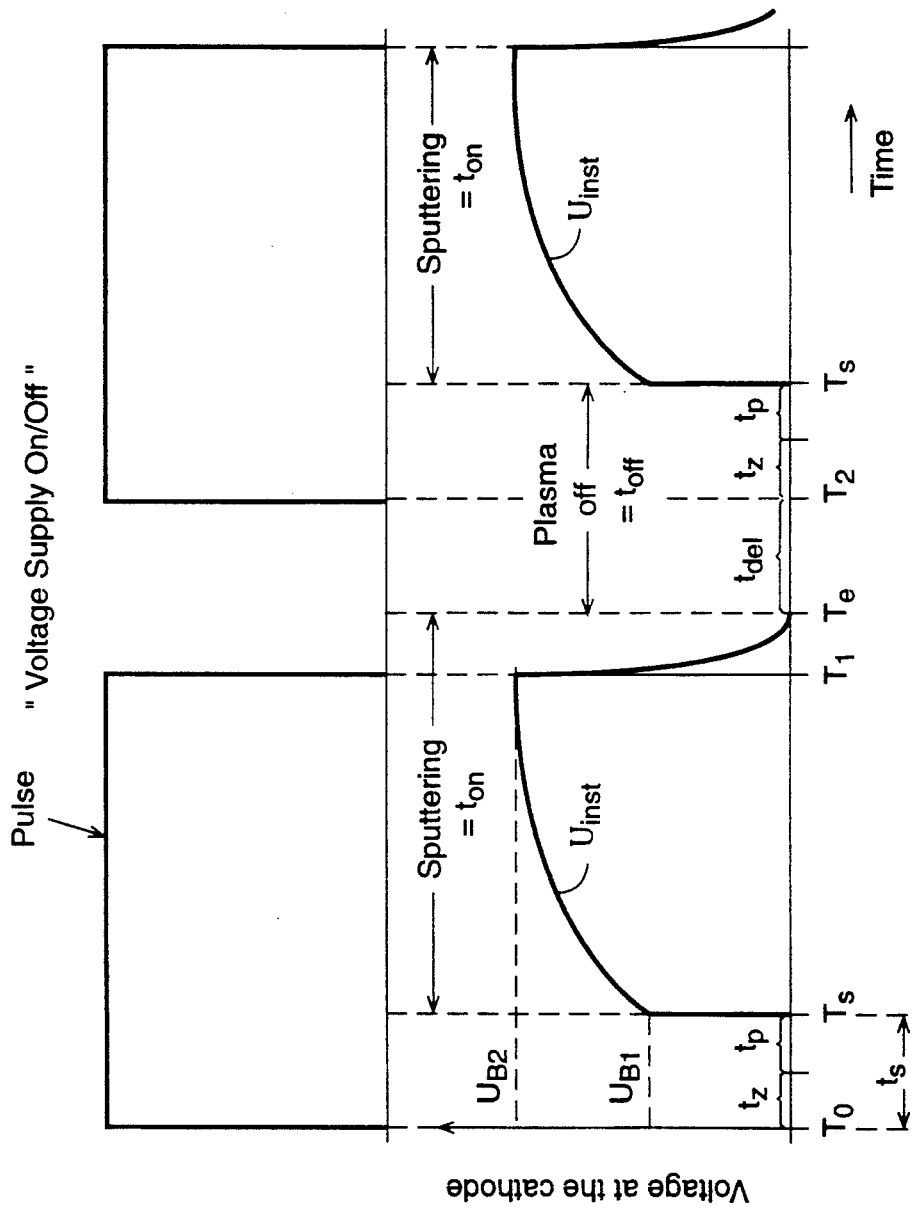
FIG. 3 shows a graphic representation of the voltage of the cathode during different on and off pulses.

In FIG. 3 is depicted the instantaneous voltage at the cathode during pulse operation. The points in time herein are denoted by upper case letters while the time intervals are denoted by lower case letters.

At time $T_0$ the voltage supply is switched on and at time $T_1$ it is switched off.

After switching on the voltage supply, time $t_s$ elapses before the sputtering process starts at time $T_s$. The sputtering power increases up to time $T_1$, which is comparable with time $t_\infty$ from FIGS. 1, 2, to the maximum value $U_{B2}$, for the reasons described above. If the voltage supply is switched off at time $T_1$, the sputtering process decreases to zero at the latest at time $T_e$.

According to the invention, only after a delay time $t_{del}$ is the voltage supply switched on again at time $T_2$. The coating time or sputtering time is hereby determined to be: $t_{on} = T_e - T_s$ while the non-coating time is $t_{off} = t_{del} + t_z + t_p = t_{del} + t_s$. The sputtering process consequently is interrupted from time $T_e$ to time $T_s$ in order to begin sputtering again at time $T_s$ with the renewed firing with the next pulse.

Figure 4:
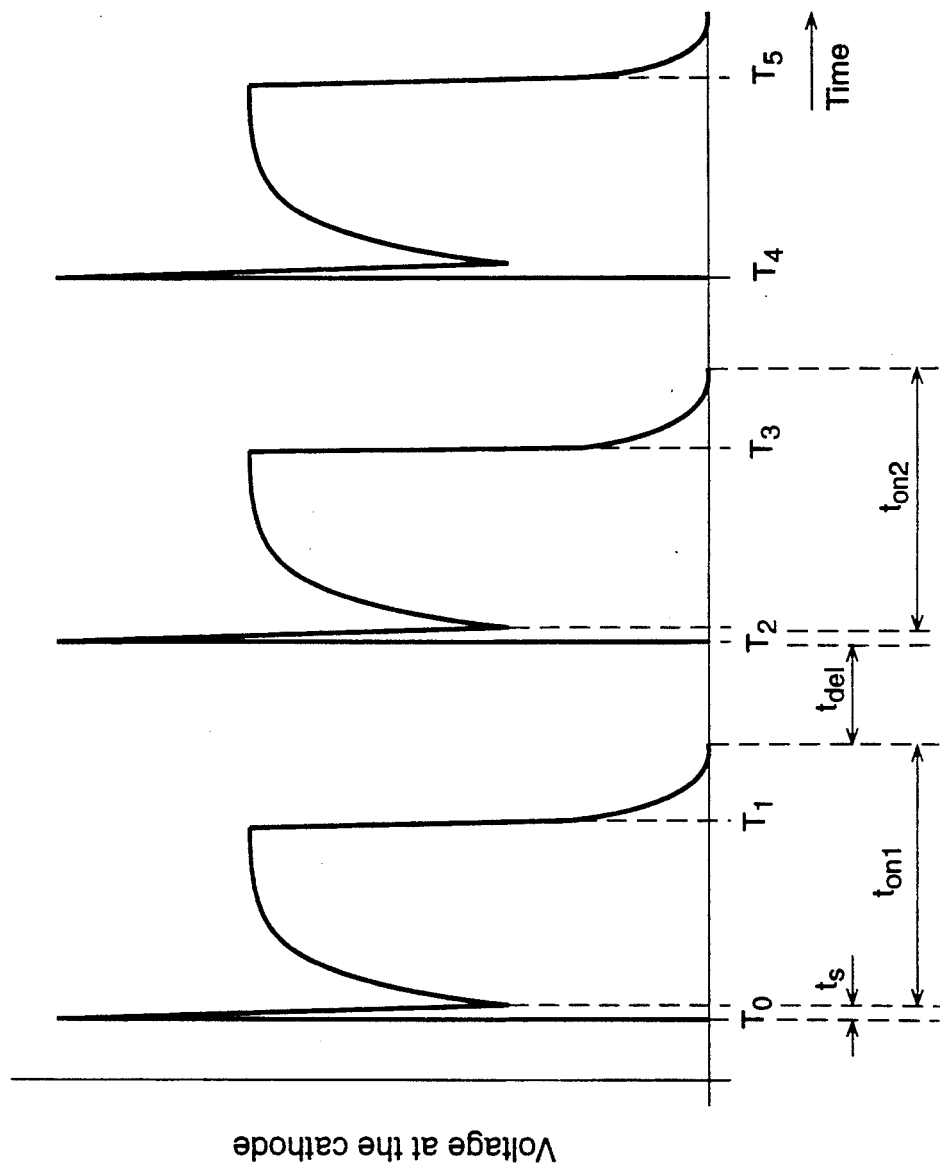
FIG. 4 shows a further graphic representation of the voltage at the cathode at different times.

In FIG. 4 is depicted the time trace of the cathode voltage with several trigger pulses of the voltage supply. Since time $t_s$ is physically given, the definable delay time $t_{del}$ can be used for purposes of regulation.

It should be ensured that the non-coating time $t_z + t_p + t_{del}$ is selected sufficiently short so that the applied layer is not generated with too great a waviness. If it is assumed that the clock interval, i.e. the non-coating time is selected so large that in this time one half of the substrate has passed the cathode before the next coating starts, then one half of the substrate would be coated and one half uncoated. If the interval time is shortened, two successive coatings shift closer and closer together until they overlap. But overlapping is equivalent with the fact that a part of the substrate is coated twice while other areas are coated only once. This developing non-uniformity in the coating thickness can be referred to as waviness.

The switch-off time consequently must overall be very much smaller than the substrate advance time substrate. If the path which must be travelled by the substrate during the non-coating time is denoted by S, it applies that the off-time is, for example $t_{on1} - t_{on-2} << S/v_{substrate}$. S should be very small so that the time during which the substrate is coated is large relative to the off-time. Expressed differently, the current supply during the coating time should be switched on and switched off very frequently.

Figure 5:
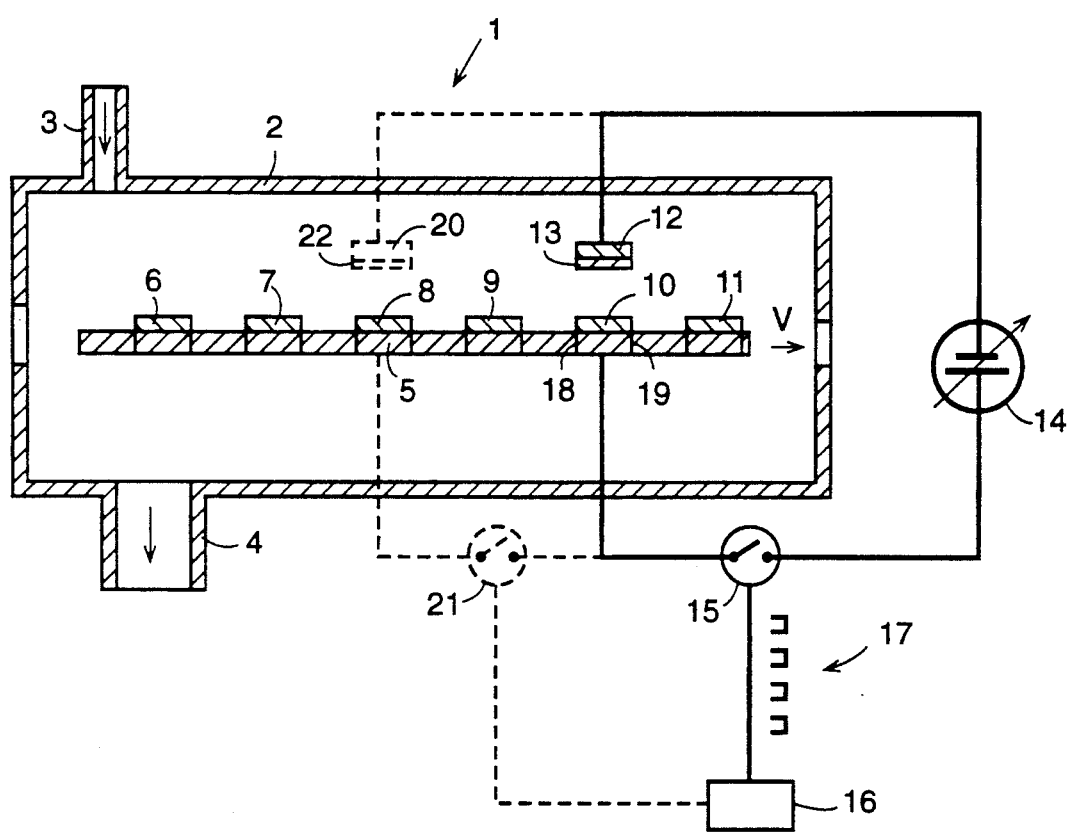
FIG. 5 shows a schematic representation of a sputtering installation with linearly moved substrates.

In FIG. 5 is depicted schematically a sputtering installation 1 having a housing 2 with a gas inlet 3 and a suction port 4 for the generation of a vacuum in housing 2. In the housing is disposed a linearly movable carrier 5 for several substrates 6 to 11, above which is disposed a cathode 12 with a target 13. Reference numerals 18, 19 designate isolating border lines defining a plurality of spaced apart anodes. Without such border lines the substrate below 6–11 would have the same electrical potential at any place.

The cathode 12 is connected with the negative pole of a regulatable dc voltage source 14 whose positive pole is connected with the carrier 5 which consequently acts as an anode. In the circuit formed by the anode/cathode path 5, 12 and the voltage source 14 is disposed a switch 15 clocked by a control device 16. The clock pulses 17 with respect to their sequence and pulse width can herein be changed. The pulse width indicates the length of time during which the switch 15 is closed.

If switch 15 is closed, the voltage between the anode 5 and the cathode 12 has the same trace as shown in FIG. 1 or FIG. 4.

Since the carrier 5 moves with the speed v toward the right, the substrate 10 is located beneath the target only for a given time. During this time the voltage source 14 is for example applied 100 times to the anode/cathode path and switched off again, and specifically according to the method shown in FIGS. 1 to 4.

It is understood that in the housing 2 several anode/cathode paths 20 can also be provided, as is indicated by the dashed lines. With the aid of further switches 21 these additional cathode/anode paths can be clocked with a different clock frequency and in different pulse widths. Additional targets 22 can differ from one another with respect to their material composition.

The voltage source or current supply 14 can be power-regulated, current-regulated, or voltage-regulated, and is not shown in detail. If it is power-regulated, upon an increase of the pressure in chamber 2 and with unclocked dc current sputtering, the voltage will decrease and the current increase. The current regulation keeps the current constant so that the voltage decreases more strongly with increased pressure. Conversely, a voltage control keeps the voltage constant, whereby the current increases with increasing pressure. In all three cases, the voltage at the cathode is used as regulating variable. Depending on the type of control, the voltage is changed, or kept constant, in the case of voltage control until the selected nominal (set) value has been reached.

All three types of regulation can also be used with clocked voltage since here too as a regulation parameter the voltage value $U_{nom}$ is used. The pressure in the chamber 2 is, for example, between $10^{-4}$ mbars and $10^{-2}$ mbars when the noble gas argon is used.

The sputtering cathodes 12, 20 can be selected to be of different size, whereby at a given firing voltage and power density, different powers and currents result. For example, a cathode having a length of 75 cm and a width of 24 cm for a target surface of 1800 cm$^2$, a firing voltage of 500 V and a power density of 25 W/cm$^2$, has a power of 45 kW at a current of 90 A. For a cathode having a length of 250 cm. and a width of 24 cm for a target surface of 6000 cm$^2$, the power is 150 kW at a current of 300 A, wherein the firing voltage is 500 V and the power density 25 W/cm$^2$.

The invention differs from the conventional sputtering technique in which the term "maximum rate sputtering" is used frequently, which means that a layer thickness is built up with maximum speed or in minimum time, in that sputtering takes place at the lowest possible rate in order to apply in a given time a thin layer of the desired thickness. Consequently, this is "minimum rate sputtering".

I claim:

1. Sputtering device for providing a plurality of substrates with thin layers of desired thickness, each of said substrates being electrically coupled to a respective anode, comprising:
   a) a plurality of said anodes being spaced apart;
   b) a respective plurality of spaced apart cathodes each being electrically connected with a respective sputtering target;
   c) means for supplying a D.C. voltage coupled between respective pairs of said plurality of anodes and said plurality of cathodes, said pairs of anodes and said cathodes forming a plurality of anode/cathode paths, and said anode/cathode paths and said D.C. voltage supplying means forming electrical circuits;
   d) means for moving said plurality of substrates with respect to the plurality of cathodes;
   e) means for interrupting said electrical circuits formed by said plurality of anode/cathode paths and said D.C. voltage supplying means;
   f) said interrupting means being means for providing a regulatable ON time interval at said plurality of cathodes and a regulatable OFF time interval at said plurality of cathodes with the time between two ON time intervals being very small compared to the time required by the substrate to move past a cathode.

2. A device as defined in claim 1 wherein said ON interval is at least $t_z + t_p$ where $t_z$ is the time required for firing said plasma after switching on said D.C. voltage supplying means and $t_p$ is a constant.

3. A device as defined in claim 2 wherein $t_z + t_p$ is approximately 1 $\mu$s to 12 $\mu$s.

4. A device as defined in claim 2 wherein said OFF time interval between two ON time intervals is $t_z + t_p + t_{del}$ where $t_{del}$ is a variable time delay used for purposes of regulation.

5. A device as defined in claim 1 wherein each of said targets is different.

6. A device as stated in claim 1 wherein said plurality of said cathodes are disposed in one plane.

7. A sputtering method for providing substrates with thin layers of desired thickness, said substrates being movably arranged at a distance from at least one target, said target being temporarily connected to a D.C. source, said method comprising the following steps:
   a) moving the substrates with a speed $V << S/T_s - T_e$ wherein S is the path which is travelled by the substrate during a non-coating time interval $T_s - T_e$;
   b) connecting the D.C. source to said target with a time interval of at least $t_z + t_p$ wherein $t_z$ is the time after connecting the D.C. source to said target for firing a plasma and $t_p$ is a constant, and when $t_z + t_p$ is approximately 1 $\mu$s to 12 $\mu$s;
   c) regulating a time interval $t_{del}$ being defined by $(T_s - T_e) - (t_z + t_p)$.

* * * * *